(12) United States Patent
Nishizawa et al.

(10) Patent No.: US 8,021,968 B2
(45) Date of Patent: Sep. 20, 2011

(54) SUSCEPTOR AND METHOD FOR MANUFACTURING SILICON EPITAXIAL WAFER

(75) Inventors: Tsuyoshi Nishizawa, Annaka (JP); Yoshio Hagiwara, Annaka (JP); Hideki Hariya, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 12/452,862

(22) PCT Filed: Jul. 30, 2008

(86) PCT No.: PCT/JP2008/063661
§ 371 (c)(1),
(2), (4) Date: Jan. 26, 2010

(87) PCT Pub. No.: WO2009/020024
PCT Pub. Date: Feb. 12, 2009

(65) Prior Publication Data
US 2010/0129990 A1 May 27, 2010

(30) Foreign Application Priority Data
Aug. 3, 2007 (JP) ................................. 2007-203080

(51) Int. Cl.
*H01L 21/20* (2006.01)
*H01L 21/36* (2006.01)

(52) U.S. Cl. .......... 438/503; 117/84; 118/500; 118/728; 156/345.51; 257/E21.461; 438/492; 438/507

(58) Field of Classification Search .................... 117/84; 118/500, 728; 156/345.51; 438/492, 503, 438/507; 257/E21.461
See application file for complete search history.

(56) References Cited

U.S. PATENT DOCUMENTS
2006/0065196 A1* 3/2006 Yokogawa .................... 118/728

FOREIGN PATENT DOCUMENTS
| JP | A-2-174116 | 7/1990 |
| JP | A-7-335572 | 12/1995 |
| JP | A-2000-21788 | 1/2000 |
| JP | B2-3900154 | 4/2007 |
| WO | WO 02/097872 A1 | 12/2002 |

OTHER PUBLICATIONS
International Search Report issued in Application No. PCT/JP2008/063661 on Oct. 28, 2008.

* cited by examiner

*Primary Examiner* — Asok Sarkar
(74) *Attorney, Agent, or Firm* — Oliff & Berridge, PLC

(57) ABSTRACT

Provided is a susceptor 13 for manufacturing an epitaxial wafer, comprising a mesh-like groove 13b on a mount face on which a silicon substrate W is to be mounted, wherein a coating H of silicon carbide is formed on the mount face, and the coating has a surface roughness of 1 μm or more in centerline average roughness Ra and a maximum height of a protrusion 13p generated in forming the coating H of 5 μm or less. Thus, defects such as warping and slip as well as adhesion of the silicon substrate to the susceptor are prevented.

5 Claims, 4 Drawing Sheets

SUSCEPTOR AND METHOD FOR MANUFACTURING SILICON EPITAXIAL WAFER

TECHNICAL FIELD

The present invention is in the field of manufacture of a silicon epitaxial wafer in which a silicon epitaxial layer is grown in vapor phase, and relates to a susceptor on which a single crystal silicon substrate is to be mounted and a method for manufacturing a silicon epitaxial wafer using the same.

BACKGROUND ART

Conventionally known methods for manufacturing a silicon epitaxial wafer (hereinafter referred to as epitaxial wafer or just wafer) are to grow in vapor phase a silicon epitaxial layer (hereinafter referred to as epitaxial layer) on a main surface of a single crystal silicon substrate (hereinafter referred to as silicon substrate).

According to this manufacture of an epitaxial wafer, silicon source gas is supplied onto a main surface of a silicon substrate mounted on a susceptor in a reaction chamber with heating the silicon substrate, so that an epitaxial layer is grown in vapor phase.

In this manufacturing process of an epitaxial wafer, warping occurs in the silicon substrate due to the heating. For this reason, a susceptor on which the silicon substrate is mounted is provided with a pocket formed so as to coincide with the warping, and the silicon substrate is mounted onto a bottom face of the pocket. Besides this, various methods to suppress the warping have been proposed (for example, see patent documents 1 and 2).

In some cases, a mesh-like groove as a path for gas is formed on a face of such susceptors on which a silicon substrate is to be mounted. It provides advantages that a silicon substrate can be easily dismounted from the susceptor when removing it, as well as that a silicon substrate is prevented from displacement in mounting it. These susceptors used therein are normally made of graphite as its base and coated with silicon carbide coating. This is because graphite reacts with source gas so that the surface thereof changes to silicon carbide during a process of vapor phase growth. For this reason, they are coated with silicon carbide previously. The silicon carbide coating is normally formed by CVD (chemical vapor deposition method). When the above-mentioned mesh-like groove is provided on a face on which a silicon substrate is to be mounted, the silicon carbide coating is formed after the groove is processed, and thereafter a finishing polish is given to the face. However, if the face is polished excessively, there occurs a problem that a silicon substrate sticks to the susceptor (see FIG. 4B). In order to prevent this adhesion, it has been proposed a technique of allowing this face to have a surface roughness of 1 μm or more in average roughness and 10 μm or more in maximum roughness (for example, see patent document 3).

Patent document 1: Japanese patent publication No. 3900154
Patent document 2: WO2002/097872
Patent document 3: Japanese patent application publication No. Hei2-174116

DISCLOSURE OF THE INVENTION

Problem To Be Solved By the Invention

However, the technique of patent document 3 cannot prevent occurrence of a defect due to a protrusion of the coating even polish is given, because the maximum roughness is 10 μm or more. The protrusion of the coating is caused by abnormal growth of silicon carbide which occurs in forming the coating onto the mesh-like part, and the protrusion contacts with a back face of a silicon substrate to bring defects such as convex warping or slip into the silicon substrate (see FIG. 4A) which is unevenness due to thermal stress.

The present invention has been made in consideration of the above circumstances, and is to provide a susceptor which can prevent occurrence of the defects such as warping and slip as well as adhesion of the silicon substrate to the susceptor, and a method for manufacturing a silicon epitaxial wafer using the same.

Means For Solving the Problem

In order to solve the above problems, the present inventors studied about occurrence of adhesion and defects regarding various mesh patterns of the susceptor. As a result, the present inventors have found that the coating of the mount face having a centerline average roughness Ra and a maximum height of protrusion respectively within predetermined ranges can prevent occurrence of the defects such as warping and slip as well as the adhesion of the silicon substrate to the susceptor. The present invention has been thus proposed.

The susceptor of the present invention is one for manufacturing an epitaxial wafer, comprising a mesh-like groove on a mount face on which a silicon substrate is to be mounted, wherein
a coating of silicon carbide is formed on the mount face, and
the coating has a surface roughness of 1 μm or more in centerline average roughness Ra and a maximum height of a protrusion generated in forming the coating of 5 μm or less.

According to the susceptor of the present invention, the adhesion of the silicon substrate to the susceptor is prevented by the coating of silicon carbide which has a surface roughness of 1 μm or more in centerline average roughness Ra, the coating being on the mount face of the silicon substrate where the mesh-like groove is formed. Furthermore, defects such as warping and slip are prevented by the coating in which the protrusion has a maximum height of 5 μm or less, the protrusion being generated in forming the coating at the mount face.

It is preferable that a surface of the coating on the mount face is polished.

The method for manufacturing an epitaxial wafer of the present invention is one comprising the steps of growing in vapor phase an epitaxial layer on a main surface of a silicon substrate by using the above-mentioned susceptor.

According to the method for manufacturing an epitaxial wafer of the present invention, it becomes possible to manufacture an epitaxial wafer in which defects such as warping and slip as well as adhesion of the silicon substrate to the susceptor are eliminated, since the epitaxial layer is grown in vapor phase on the main surface of the silicon substrate by using the above-mentioned susceptor.

Advantages of the Invention

According to the present invention, adhesion of a silicon substrate to the susceptor can be prevented by the coating of silicon carbide on the silicon substrate mount face of the susceptor which has the surface roughness of 1 μm or more in centerline average roughness Ra. Furthermore, defects such as warping and slip of the silicon substrate can be prevented by the coating in which the protrusion has the maximum height of 5 μm or less, the protrusion being generated in forming the coating at the mount face of the susceptor.

BEST MODE FOR CARRYING OUT THE INVENTION

Hereinafter, an embodiment of the present invention is described with reference to the drawings.

First, as a suitable example of a vapor phase growth apparatus used in the present invention, a structure of a single-wafer vapor phase growth apparatus is described.

Figure 1:
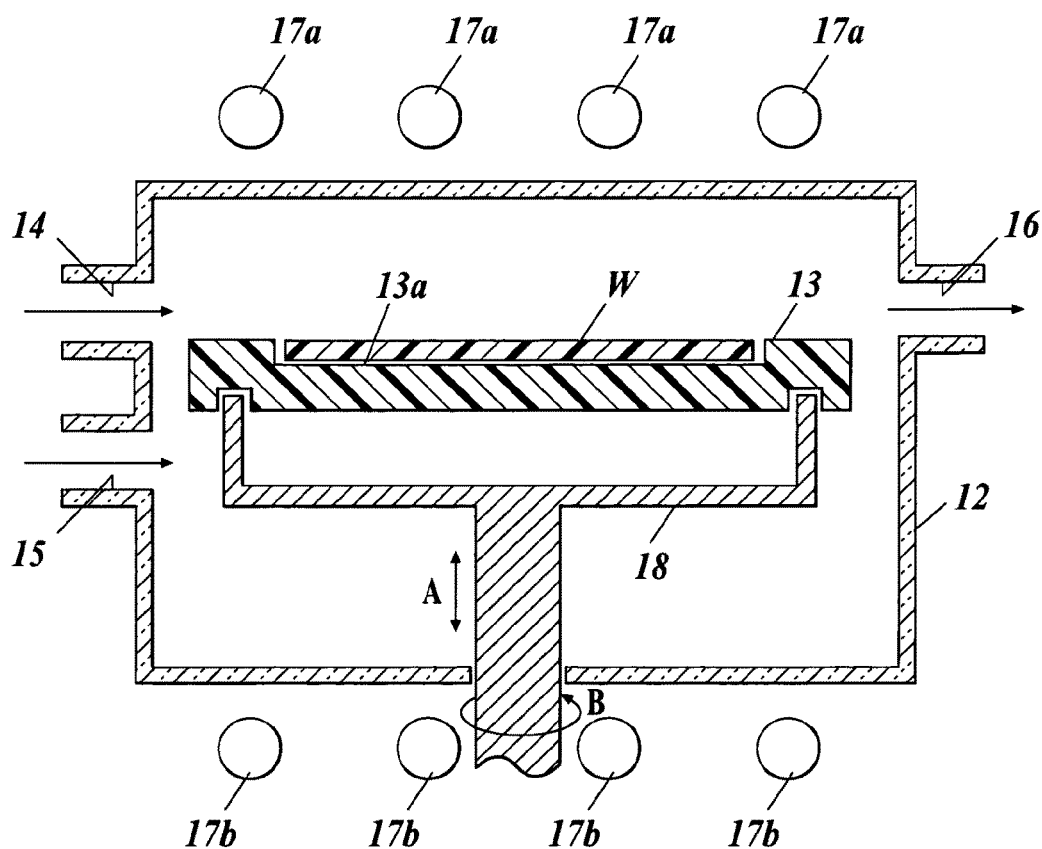
FIG. 1 is a schematic sectional view of a vapor phase growth apparatus of the embodiment.

As shown in FIG. 1, a vapor phase growth apparatus 11 comprises a reaction chamber 12 made of clear quartz, and a susceptor 13 provided inside the reaction chamber 12 to support a silicon substrate W with an upper face thereof.

To the reaction chamber 12, a vapor phase growth gas introduction pipe 14 is provided which is to introduce a gas for vapor phase growth containing a source gas (for example, trichlorosilane) and a carrier gas (for example, hydrogen) to an area over the susceptor 13 in the reaction chamber 12 so as to supply the gas onto a main surface of the silicon substrate W on the susceptor 13.

At the same side (the left side in FIG. 1) with the side where the vapor phase growth gas introduction pipe 14 is provided in the reaction chamber 12, a purge gas introduction pipe 15 is provided which is to introduce purge gas (for example, hydrogen) to an area under the susceptor 13 in the reaction chamber 12.

Further, at the opposite side (the right side in FIG. 1) to the side where the vapor phase growth gas introduction pipe 14 and purge gas introduction pipe 15 are provided in the reaction chamber 12, a discharge pipe 16 is provided which is to discharge a gas in the reaction chamber 12 (the gas for vapor phase growth and purge gas).

Outside of the reaction chamber 12, a plurality of heating devices 17a and 17b are provided which are to heat the reaction chamber 12 from the upper and lower sides. For example, halogen lamps are given as the heating devices 17a and 17b. The number of the heating devices 17a and 17b is specified in FIG. 1 for descriptive purposes, however the number is not limited thereto.

The susceptor 13 is formed in approximately a disk form, for example. On the main surface thereof, a pocket 13a is formed which is a depression having approximately a disk form in the planer view for positioning the silicon substrate W.

Figure 2A:
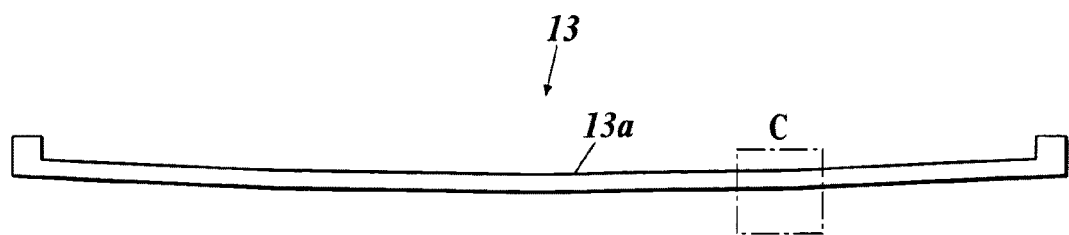
FIG. 2A is a sectional view of a susceptor of the embodiment.
Figure 2B:
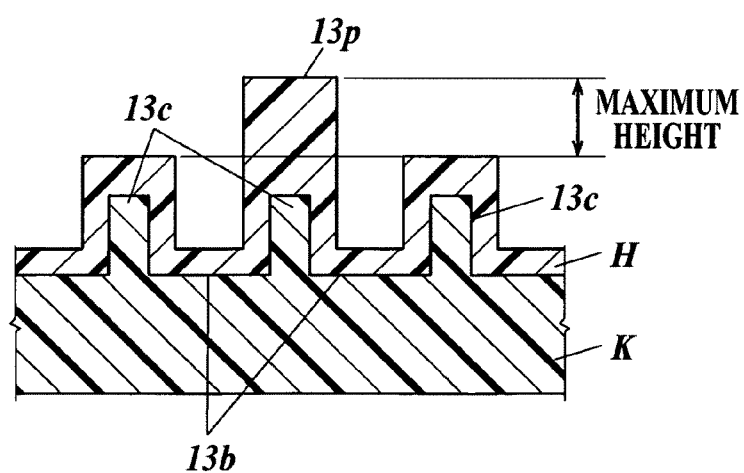
FIG. 2B is an enlarged view of portion C in FIG. 2A.

The susceptor 13 is made of a base K of graphite coated with a coating H of silicon carbide. As shown in FIGS. 2A and 2B, the base K includes a mesh-like groove 13b as a path for gas on a bottom face of the pocket 13a on which the silicon substrate W is to be mounted. FIG. 2A is a cross sectional view of the susceptor 13 and FIG. 2B is an enlarged view of portion C in FIG. 2A. The groove 13b is formed with 0.6 to 2 mm pitch. A convex 13c of the base K surrounded by the groove 13b is a square having a top face of 0.1 to 0.5 mm square. The mesh-like groove 13b provides advantages that the silicon substrate W can be easily dismounted from the susceptor 13 when removing it, as well as that the silicon substrate W is prevented from displacement when mounting it.

As constituent material of the susceptor 13, graphite is used for the base K and silicon carbide for the coating H as described above. The usage of graphite for the base K relates to the fact that high-frequency induction heating was a major heating method of vapor phase growth apparatuses at first. Besides, there are also merits of availability of high purity materials, easy processability, superior heat conductance, and high resistance to failure. However, there are problems that graphite may release adsorbed gas during the process because it is a porous material, and that graphite reacts with source gas during a procedure of vapor phase growth so that a surface of the susceptor changes to silicon carbide, and so on. For that, it is general to coat the surface with the coating H of silicon carbide previously. The coating H of silicon carbide is normally formed with CVD (chemical vapor deposition method) and has a thickness of 50 to 200 μm.

The coating H of silicon carbide is formed after the above mesh-like groove 13b is formed. The coating H on the convex 13c sometimes grows abnormally in its formation, so as to be a protrusion 13p as shown in FIG. 2B. The protrusion 13p, if it reaches a certain height or more, contacts with the silicon substrate W, and thus causes defects such as warping and slip. For that, finishing polish is given so that a maximum height of the protrusion 13p becomes 5 μm or less. Also in the finishing polish, an centerline average roughness Ra is controlled to be 1 μm or more for preventing that the silicon substrate W sticks to the susceptor 13 due to overpolish. When the finishing polish is given to the mount face for the silicon substrate W of the susceptor 13 as above, it becomes possible to prevent the adhesion of the silicon substrate W to the susceptor 13 and the defects such as warping and slip of the silicon substrate W. The finishing polish may be given by either conventionally known machine polish or hand polish, as long as those surface roughness and protrusion height are achieved.

At the back face of the susceptor 13, a susceptor supporter 18 to support susceptor 13 is provided as shown in FIG. 1. The susceptor supporter 18 is movable in a vertical direction as shown by arrow A, and rotatable in a direction as shown by arrow B.

Figure 3:
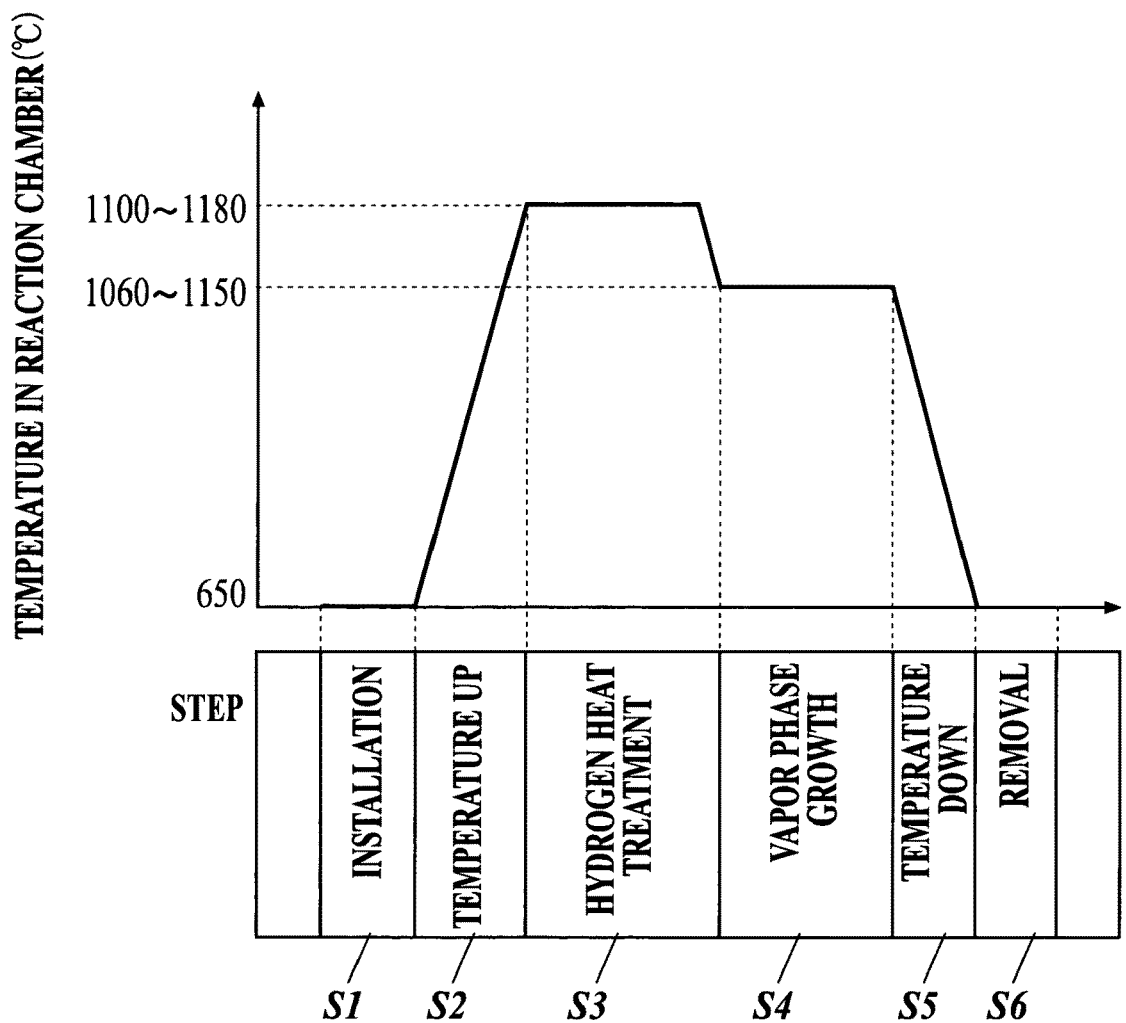
FIG. 3 is a view showing a change in temperature in a process of manufacturing an epitaxial wafer of the embodiment.
Figure 4A:
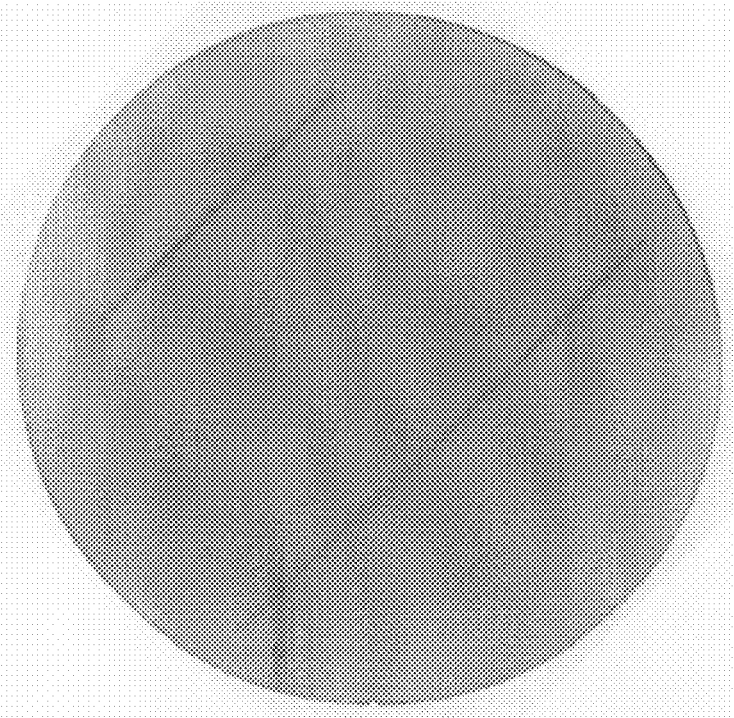
FIG. 4A is a view showing an example where slip occurs.
Figure 4B:
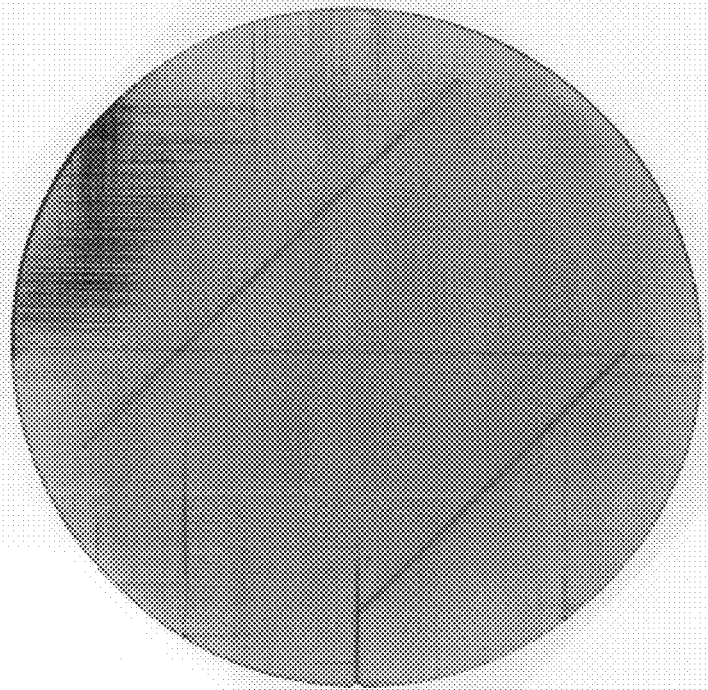
FIG. 4B is a view showing an example where adhesion occurs.

Next, a process to grow in vapor phase an epitaxial layer on the main surface of the silicon substrate W is described with reference to FIGS. 1 and 3. FIG. 3 shows an example of a change in temperature inside the reaction chamber 12 in this process.

First, the silicon substrate W is installed into the reaction chamber 12 where the temperature is controlled to an installation temperature (for example, 650° C.), and is mounted in the pocket 13a on the upper face of the susceptor 13 with its main surface facing upwardly (step S1).

Here, before the silicon substrate W is installed, hydrogen gas has been introduced into the reaction chamber 12 through the vapor phase growth gas introduction pipe 14 and purge gas introduction pipe 15.

Next, the silicon substrate W on the susceptor 13 is heated up to a hydrogen heat treatment temperature (for example, 1100° C. to 1180° C.) with the heating devices 17a and 17b (step S2).

Next, vapor phase etching is performed in order to remove a native oxide film formed on the main surface of the silicon substrate W (step S3). Specifically, the vapor phase etching is being performed until just before the next step of a vapor phase growth.

Next, the silicon substrate W is cooled to a desired growth temperature (for example, 1060° C. to 1150° C.). The source gas (for example, trichlorosilane) and purge gas (for example, hydrogen) are supplied onto the main surface of the silicon substrate W approximately in parallel thorough the vapor phase growth gas introduction pipe 14 and purge gas introduction pipe 15 respectively, so as to let an epitaxial layer grow in vapor phase on the main surface of the silicon substrate W, and thus an epitaxial wafer is manufactured (step S4). The purge gas is supplied with a higher pressure than the source gas. This is to prevent the source gas from going into a space under the susceptor 13 thorough a gap between the reaction chamber 12 and the susceptor 13.

Finally, the epitaxial wafer is cooled to a removal temperature (for example, 650° C.) (step S5), and carried out of the reaction chamber 12 (step S6).

According to this method for manufacturing an epitaxial wafer, the susceptor 13 used therein has the coating H at the mount face such that a surface roughness is 1 μm or more in centerline average roughness Ra and the maximum height of the protrusion 13p is 5 μm or less. Thus, it becomes possible to perform a manufacture of an epitaxial wafer where occurrence of defects such as warping and slip as well as the adhesion of the silicon substrate W to the susceptor 13 are eliminated.

EXAMPLES

Hereinafter, the present invention is described more specifically by giving inventive examples and comparative examples.

Susceptors A to H shown in the following Table 1 were prepared as the susceptor 13 of the present embodiment, and epitaxial wafers were produced with these susceptors.

of the protrusion 13p (maximum protrusion height) and polish condition were shown in Table 1.

The polish conditions shown in Table 1 are further described. A technique of same material abrasive polish using a small piece of silicon carbide by a hand polish was employed for susceptors C and D, and machine processing was employed for all of the other susceptors. Among machine-processed ones, susceptor A was subjected to removal of only the protrusion 13p, and susceptor B was further subjected to a discreet surface polish in addition to the treatment of susceptor A. Susceptor E was subjected to a finishing polish for a sufficient time, and susceptor F was subjected to only a finishing polish without a rough grind. Susceptors G and H were subjected to a rough grind followed by a finishing polish, and had a minimum surface roughness.

[Evaluation of Wafer Quality]

The epitaxial wafers produced by using the above susceptors A to H were checked in warping, slip and periphery adhesion. The results are shown in Table 2. In the table, "−" (minus) denotes that the defect as above was not found, and "+" (plus) denotes that the defect was found. X-ray topography was employed to check the slip and periphery adhesion.

TABLE 2

| | EMPLOYED SUSCEPTOR | WARPING | SLIP | ADHESION |
|---|---|---|---|---|
| COMPARATIVE EXAMPLE | SUSCEPTOR A | + | + | − |
| | SUSCEPTOR B | + | + | − |
| INVENTIVE EXAMPLE | SUSCEPTOR C | − | − | − |
| | SUSCEPTOR D | − | − | − |
| COMPARATIVE EXAMPLE | SUSCEPTOR E | − | − | + |
| | SUSCEPTOR F | − | − | + |
| | SUSCEPTOR G | − | − | + |
| | SUSCEPTOR H | − | − | + |

According to the result shown in Table 2, warping and slip were not found in the wafers from susceptors C to H, and

TABLE 1

| | SUSCEPTOR | POLISH CONDITION | MAXIMUM PROTRUSION HEIGHT μm | SURFACE ROUGHNESS Ra μm |
|---|---|---|---|---|
| COMPARATIVE EXAMPLE | SUSCEPTOR A | ONLY PROTRUSION POLISH | 22 | 1.2 TO 3.1 INCLUSIVE |
| | SUSCEPTOR B | PROTRUSION POLISH PLUS DISCREET SURFACE POLISH | 36 | 1.1 TO 3.8 INCLUSIVE |
| EXAMPLE | SUSCEPTOR C | SAME MATERIAL ABRASIVE POLISH | LESS THAN 5 | 1.0 TO 5.0 INCLUSIVE |
| | SUSCEPTOR D | SAME MATERIAL ABRASIVE POLISH | LESS THAN 5 | 1.0 TO 3.0 INCLUSIVE |
| COMPARATIVE EXAMPLE | SUSCEPTOR E | MAXIMUM POLISH | LESS THAN 5 | 0.43 TO 0.78 INCLUSIVE |
| | SUSCEPTOR F | ONLY FINISHING POLISH | LESS THAN 5 | 0.65 TO 0.90 INCLUSIVE |
| | SUSCEPTOR G | ROUGH GRIND → FINISHING POLISH | LESS THAN 5 | 0.11 TO 0.17 INCLUSIVE |
| | SUSCEPTOR H | ROUGH GRIND → FINISHING POLISH | LESS THAN 5 | 0.11 TO 0.17 INCLUSIVE |

In the present examples, "EPSILON" (product name) produced by ASM Inc. was used as the vapor phase growth apparatus 11. The epitaxial wafers were prepared such that non-doped epitaxial layers were grown in vapor phase with a target thickness of 70 μm on p-type silicon substrates W having a diameter of 200 mm and a plane orientation of (100) on the main surface thereof.

A thickness of the silicon carbide coating of the susceptor 13 was set to 100 μm. Regarding the face of the susceptor 13 on which the silicon substrate W is mounted, the centerline average roughness Ra (surface roughness), maximum height adhesion was not found in the wafers from the susceptors A to D. Therefore, it was found that the warping and slip did not occur when the maximum height of the protrusion 13p was 5 μm or less, and that the adhesion did not occur when the surface roughness was 1 μm or more in centerline average roughness Ra.

As described above, according to the susceptor of the present invention, the adhesion of a silicon substrate W to the susceptor 13 can be prevented by the coating H of silicon carbide which has the surface roughness of 1 μm or more in centerline average roughness Ra, the coating H being on the mount face of the silicon substrate W where the mesh-like groove 13*b* is formed. Furthermore, the defects such as warping and slip can be prevented by the coating H in which the protrusion 13*p* has the maximum height of 5 μm or less, the protrusion 13*p* being generated in forming the coating H at the mount face.

Further, according to the method for manufacturing an epitaxial wafer of the present invention, the susceptor 13 as described above is used to grow an epitaxial layer on the main surface of the silicon substrate W. Thus, it becomes possible to perform a manufacture of an epitaxial wafer where occurrence of the defects such as warping and slip as well as the adhesion of the silicon substrate W to the susceptor 13 are eliminated.

INDUSTRIAL APPLICABILITY

As described above, the susceptor and the method for manufacturing a silicon epitaxial wafer of the present invention are useful in preventing adhesion of a silicon substrate to a susceptor and occurrence of defects such as warping and slip, compared to a conventional art.

EXPLANATION OF REFERENCE NUMERALS

H coating
W silicon substrate
13 susceptor
13*b* groove
13*p* protrusion

The invention claimed is:

1. A susceptor for manufacturing a silicon epitaxial wafer, comprising a mesh-like groove on a mount face to which a single crystal silicon substrate is to be mounted, wherein
a coating of silicon carbide is formed on the mount face,
the coating has a surface roughness of 1 μm or more in centerline average roughness Ra and a maximum height of a protrusion generated in forming the coating of 5 μm or less.

2. The susceptor of claim 1, wherein a surface of the coating is polished.

3. A method for manufacturing a silicon epitaxial wafer, comprising the step of growing in vapor phase a silicon epitaxial layer on a main surface of a single crystal silicon substrate by using the susceptor of claim 2.

4. A method for manufacturing a silicon epitaxial wafer, comprising the step of growing in vapor phase a silicon epitaxial layer on a main surface of a single crystal silicon substrate by using the susceptor of claim 1.

5. The susceptor of claim 1, further comprising convex portions, each convex portion having a top face of 0.1 to 0.5 mm square, wherein
the mesh-like groove includes a plurality of grooves having a 0.6 to 2 mm pitch, the plurality of grooves surrounding the convex portions.

* * * * *